(12) United States Patent
Peng

(10) Patent No.: US 11,782,549 B2
(45) Date of Patent: Oct. 10, 2023

(54) DISPLAY PANEL AND DISPLAY DEVICE

(71) Applicant: KunShan Go-Visionox Opto-Electronics Co., Ltd., Jiangsu (CN)

(72) Inventor: ChaoChi Peng, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 48 days.

(21) Appl. No.: 17/589,266

(22) Filed: Jan. 31, 2022

(65) Prior Publication Data
US 2022/0155898 A1 May 19, 2022

Related U.S. Application Data

(63) Continuation of application No. PCT/CN2020/125440, filed on Oct. 30, 2020.

(30) Foreign Application Priority Data

Jan. 21, 2020 (CN) .......................... 202010070319.7

(51) Int. Cl.
G06F 3/041 (2006.01)
H01L 27/12 (2006.01)

(52) U.S. Cl.
CPC ........ G06F 3/04164 (2019.05); G06F 3/0412 (2013.01); H01L 27/1214 (2013.01)

(58) Field of Classification Search
CPC .. H10K 59/40; H10K 59/131; H10K 59/1315; H10K 59/00–95; H10K 50/841; G06F 3/0412; G06F 3/04164
See application file for complete search history.

(56) References Cited

U.S. PATENT DOCUMENTS

2017/0358637 A1 12/2017 Lee et al.
2018/0196564 A1* 7/2018 Lin ........................ H01L 25/167
(Continued)

FOREIGN PATENT DOCUMENTS

CN 103293727 A 9/2013
CN 103943061 A 7/2014
(Continued)

OTHER PUBLICATIONS

Chinese First Office Action for Application No. 202010070319.7 dated Feb. 3, 2021., 23 pgs.
(Continued)

*Primary Examiner* — Sanjiv D. Patel
(74) *Attorney, Agent, or Firm* — Maier & Maier, PLLC

(57) ABSTRACT

A display panel defines a display region and a non-display region located around the display region, and includes: an array layer disposed in the display region and the non-display region; a metal wiring layer disposed in part of the array layer located in the non-display region; a touch control layer, which is arranged on the side of the metal wiring layer away from the array layer and comprises a plurality of touch leads, the plurality of touch leads extending from the display region to the non-display region; a plurality of functional film layers located between the array layer and the touch control layer and located in the display region; and a conductive structure located between the metal wiring layer and the touch control layer, the plurality of touch leads being electrically connected to the metal wiring layer by the conductive structure.

20 Claims, 2 Drawing Sheets

(56) References Cited

U.S. PATENT DOCUMENTS

2019/0235702 A1* 8/2019 Wang .................... G06F 3/0445
2019/0393274 A1   12/2019 Park et al.

FOREIGN PATENT DOCUMENTS

| CN | 105824457 A   | 8/2016  |           |
|----|---------------|---------|-----------|
| CN | 105977398 A   | 9/2016  |           |
| CN | 106775173 A   | 5/2017  |           |
| CN | 107342370 A * | 11/2017 | G06F 3/0412 |
| CN | 108110033 A   | 6/2018  |           |
| CN | 108459777 A   | 8/2018  |           |
| CN | 110362227 A   | 10/2019 |           |
| CN | 111142714 A   | 5/2020  |           |
| JP | 2012043054 A  | 3/2012  |           |

OTHER PUBLICATIONS

Chinese Second Office Action for Application No. 2202010070319.7 dated , Jul. 27, 2021., 16 pgs.
Notification to Grant Patent Right for Invention for Application No. 2202010070319.7 dated Nov. 29, 2021., 6 pgs.
International Search Report for Application No. PCT/CN2020/125440 dated Jan. 27, 2021., 14 pgs.

* cited by examiner

DISPLAY PANEL AND DISPLAY DEVICE

CROSS-REFERENCE TO RELATED APPLICATIONS

The present application is a continuation-application of International (PCT) Patent Application No. PCT/CN2020/125440 filed on Oct. 30, 2020, which claims priority of Chinese Patent Application No. 202010070319.7, filed on Jan. 21, 2020, the entire contents of which are hereby incorporated by reference.

TECHNICAL FIELD

The present application relates to the field of display technology, and in particular, to a display panel and a display device.

BACKGROUND

At present, a hard-screen packaged display panel generally includes an array layer, a plurality of functional film layers, a cover plate, and a touch layer that are stacked in sequence; among them, touch traces of the touch layer are arranged at a side of the cover plate facing away from the array layer, a metal wiring layer is provided on a frame area of the array layer, and one end of each touch wiring needs to be connected to the metal wiring layer in some way, and then connected to a touch chip through the metal wiring layer.

However, a height different caused by the plurality of functional film layers and the cover plate that are stacked may exist between the touch layer and the metal wiring layer where the touch wiring is located. The existence of this height different makes it be difficult to realize electric connection between the touch wiring and the metal wiring layer.

SUMMARY OF THE DISCLOSURE

The present application mainly solves a technical problem of providing a display panel and a display device, which can realize electric connection between a touch wiring and a metal wiring layer using a conductive structure.

In order to solve the above technical problem, one technical solution adopted by the present application is to provide a display panel, which defines a display region and a non-display region located around the display region, and comprises: an array layer disposed in the display region and the non-display region; a metal wiring layer disposed in a part of the array layer located in the non-display region, wherein one end of the metal wiring layer is configured to be electrically connected to a touch chip; a touch layer located at a side of the metal wiring layer away from the array layer, wherein the touch layer comprises a plurality of touch leads, and the plurality of touch leads extend from the display region to the non-display region; a plurality of functional film layers located between the array layer and the touch control layer and located in the display region; and a conductive structure located between the metal wiring layer and the touch control layer, wherein the plurality of touch leads are electrically connected to the metal wiring layer through the conductive structure; wherein the conductive structure is located in the same layer as at least one of the functional film layers.

Among them, the conductive structure comprises: an insulation layer located between the metal wiring layer and the touch layer, wherein the metal wiring layer comprises a first area exposed from the insulation layer; and a conductive layer extending from a surface and/or an inner hole of the insulation layer and contacting the first area; wherein the plurality of touch leads are electrically connected with the metal wiring layer through the conductive layer. The conductive structure provided in this manner is simpler, and it is easy to make in process.

Among them, the insulation layer has at least two insulation sub-layers that are stacked with each other, and the conductive layer has at least two conductive sub-layers that are electrically connected with each other; the at least two insulation sub-layers and the at least two conductive sub-layers are disposed alternately, and each one of the at least two conductive sub-layers extends in a surface and/or an inner hole of an adjacent one of the at least two insulation sub-layers. The conductive structure provided in this manner is simpler, and it is easy to make in process.

Among them, the conductive structure comprises: a first insulation layer located at the side of the metal wiring layer away from the array layer, wherein the first area exposes from the first insulation layer; a first conductive layer disposed in at least a part of a surface of the first insulation layer and electrically connected with the metal wiring layer in the first area; a second insulation layer located at a side of the first conductive layer away from the first insulation layer, wherein a part of the first conductive layer exposes from the second insulation layer; and a second conductive layer disposed in at least a part of a surface of the second insulation layer, wherein a part of the second conductive layer exposing from the second insulation layer is electrically connected with the first conductive layer. In the conductive structure, by mutual cooperation between multiple insulation layers and conductive layers, the conductive structure is enabled to realize electrical connection with the touch leads and the metal wiring layer.

Among them, a part of the first insulation layer corresponding to the first area is provided with a first hole, the first conductive layer is disposed in an inner wall of the first hole and at least a part of a surface of a side of the first insulation layer away from the array layer and adjacent to the first hole; a part of the second insulation layer corresponding to the first conductive layer is provided with at least one second hole, the first hole is staggered with the at least one second hole, and the second conductive layer is disposed in at least a part of an inner wall of the second hole and at least a part of a surface of a side of the second insulation layer away from the array layer and adjacent to the second hole. In this conductive structure, the manner of realizing electrical connection is simpler.

Among them, the conductive structure further comprises: a third insulation layer located at a side of the second insulation layer away from the first conductive layer, wherein the third insulation layer is provided with at least one third hole, and the at least one third hole is arranged to be in correspondence with the at least one second hole; the second conductive layer is further disposed in at least a part of an inner wall of the third hole and at least a part of a surface of the third insulation layer adjacent to the at least one third hole. This manner can reduce a distance between the touch leads and the conductive structure as much as possible.

Among them, the at least one third hole comprises at least two third holes divide the third insulation layer into a plurality of pillars separated from each other, the second conductive layer is further disposed in top surfaces of the plurality of pillars, and the plurality of touch leads abut against and connect with the second conductive layer located on the top surfaces of the pillars. This manner can make a distance between a touch lead and a contacting area of the conductive structure be minimum.

Among them, the plurality of functional film layers comprise a planarization layer, an anode layer, a pixel definition layer, a spacer layer, and a cathode layer which are sequentially stacked in a direction away from the array layer; wherein, the material of the first insulation layer is the same as that of the planarization layer, and/or the material of the first conductive layer is the same as that of the anode layer, and/or the material of the second insulation layer is the same as that of the pixel definition layer, and/or the material of the third insulation layer is the same as that of the spacer layer, and/or the material of the second conductive layer is the same as that of the cathode layer. The above manner can reduce the complexity of the process preparation.

Among them, the display panel further comprises: a cover plate locate at a side of the touch layer away from the array layer, wherein the cover plate is disposed in both the display region and the non-display region; a sealing element surrounding between an edge of the cover plate and an edge of the array layer, wherein the sealing element is located on an outer side of the conductive structure. The above design manner can provide a protection function to reduce corrosion of external water vapor to the inner film layers of the display panel. For example, the array layer is provided with a recess corresponding to the sealing element, and the sealing element extends into the recess. This design manner can improve sealing performance of the sealing element.

Among them, the conductive structure comprises two contacting areas disposed in one side thereof adjacent to the touch layer, part of the touch leads are connected with one of the two contacting areas, and part of the touch leads are connected with the other one of the two contacting areas.

In order to solve the above technical problem, another technical solution adopted by the present application is to provide a display device comprising a display panel according to any one of the above embodiments and a touch chip, wherein the touch chip is electrically connected with the metal wiring layer.

Advantageous effect of the present application is that: the display panel provided by the present application comprises the conductive structure, the conductive structure is located between the metal wiring layer and the touch layer, and is arranged in the same layer as at least one functional film layer. By the conductive structure, a height difference between the touch leads of the touch layer and the metal wiring layer can be overcome effectively, so as to realize electric connection between the touch leads of the touch layer and the metal wiring layer; in comparison with the manner in the related art that the touch leads are electrically connected with the metal wiring layer using an FPC (flexible circuit board), the present application can omit the FPC and simplify processing steps.

BRIEF DESCRIPTION OF THE DRAWINGS

In order to describe technical solutions of embodiments of the present application more clearly, drawings required being used in the description of the embodiments will be briefly introduced below. Obviously, the drawings in the following description are merely some embodiments of the present application. For one of ordinary skill in the art, it is possible to obtain other drawings according to these drawings without paying any creative work.

DETAILED DESCRIPTION

Technical solutions in embodiments of the present application will be clearly and entirely described below with reference to the accompanying drawings in embodiments of the present application. Obviously, the described embodiments are only some embodiments of the present application, but not all embodiments. Based on the embodiments of the present application, all other embodiments obtained by one of ordinary skill in the art without paying any creative work shall fall within the protection scope of the present application.

Figure 1:
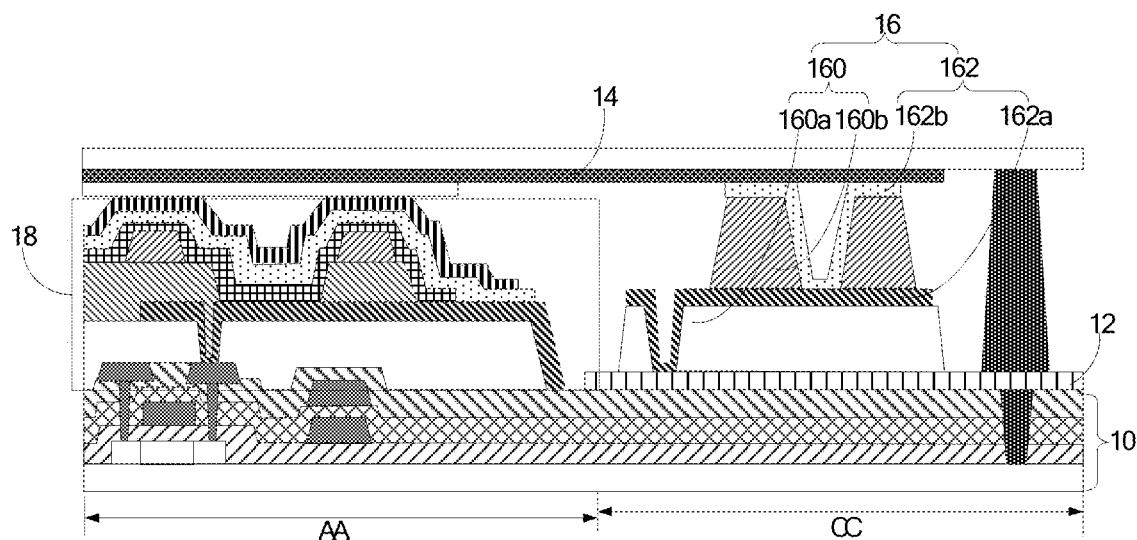
FIG. 1 is a structural schematic view of an embodiment of a display panel of the present application.
Figure 2:
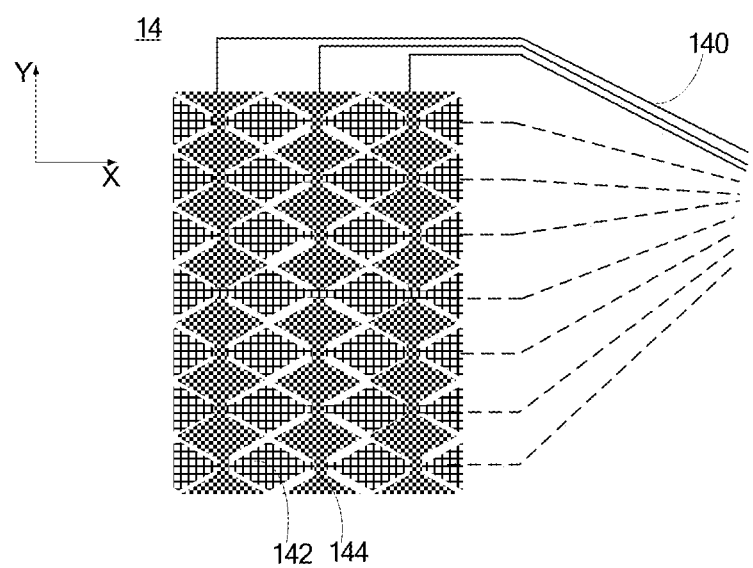
FIG. 2 is a schematic top view of an embodiment of a touch layer in FIG. 1.

Referring to FIG. 1, FIG. 1 is a structural schematic view of an embodiment of a display panel of the present application. FIG. 2 is a schematic top view of an embodiment of a touch layer in FIG. 1. The display panel defines a display region AA and a non-display region CC located around the display region AA, and the non-display region CC can also be referred to as a side edge region. The display panel includes: an array layer 10, a metal wiring layer 12, a touch layer 14, a conductive structure 16, and a plurality of functional film layers 18.

Specifically, the array layer 10 can cover the display area AA and the non-display area CC. The array layer 10 can include a plurality of thin film transistors, the plurality of thin film transistors can be only located in the display region AA and used to drive the display panel to display. The array layer 10 can further include a plurality of film layers, such as gate insulation layers; the plurality of film layers can cover the display area AA and the non-display area CC.

The metal wiring layer 12 is disposed in a part of the array layer 10 located in the non-display region CC, and an end of the metal wiring layer 12 is used to be electrically connected with a touch chip. In this embodiment, the metal wiring layer 12 can be only located in a part of the non-display region CC at one side of the display region AA, for example, the metal wiring layer 12 can be only located in a part of the non-display region CC at the right side of the display region AA in FIG. 1. Alternatively, the metal wiring layer 12 can also be located in parts of the non-display region CC at several sides of the display region AA, for example, the metal wiring layer 12 can be located in parts of the non-display region CC at both the left and right sides of the display region AA in FIG. 1. The metal wiring layer 12 can be formed by a plurality of individual metal wirings, wherein the plurality of metal wirings can be connected with the touch chip.

The touch layer 14 is disposed at a side of the metal wiring layer 12 away from the array layer 10, and is disposed to be spaced from the metal wiring layer 12. The touch layer 14 includes a plurality of touch leads 140 (as shown in FIG. 2), the plurality of touch leads 140 extend from the display region AA to the non-display region CC, for example, the plurality of touch leads 140 extends from the display region AA to the non-display region CC provided with the metal wiring layer 12. In this embodiment, the material of the touch leads 140 can be transparent and low-resistance conductive materials, for example, silver nanowires (AgNW) or the like; alternatively, the material of the touch leads 140 can be opaque conductive materials, for example, titanium, aluminum, molybdenum, silver, etc. Of course, in other embodiments, as shown in FIG. 2, the touch layer 14, besides including the touch leads 140, can further include a plurality of transmitting electrodes 142 extending along a first direction X and a plurality of receiving electrodes 144 extending along a second direction Y, and the first direction X is not parallel to the second direction Y (for example, the first direction X can be perpendicular to the second direction Y, etc.). The transmitting electrodes 142 and the receiving electrodes 144 can form self-capacitance or mutual capacitance manners therebetween, and each transmitting electrode 142 and each receiving electrode 144 has one end connected with one of the touch leads 140.

The conductive structure 16 is located between the metal wiring layer 12 and the touch layer 14, the plurality of touch leads 140 are electrically connected with the metal wiring layer 12 through the conductive structure 16.

The plurality of functional film layers 18 are located between the array layer 10 and the touch layer 14, and are located in the display region AA; wherein, the uplifted conductive layer 16 is located at the same layer as at least one of the functional film layers 18.

By the conductive structure 16, a height difference between the touch leads 140 of the touch layer 14 and the metal wiring layer 12 can be overcome effectively, so as to realize electric connection between the touch leads 140 of the touch layer 14 and the metal wiring layer 12. In comparison with the manner in the related art that the touch leads 140 are electrically connected with the metal wiring layer 12 using an FPC (flexible circuit board), the present application can omit the FPC and simplify processing steps.

In one embodiment, as shown in FIG. 1, the conductive structure 16 includes an insulation layer 160 and a conductive layer 162; the insulation layer 160 is located between the metal wiring layer 12 and the touch layer 14, and the metal wiring layer 12 comprises a first area (not labeled) exposed from the insulation layer 160; the conductive layer 162 extends from a surface and/or an inner hole of the insulation layer 160 and contacts the first area; the plurality of touch leads 140 are electrically connected with the metal wiring layer 12 through the conductive layer 162. For example, the conductive layer 162 includes a second area exposed from the insulation layer 160, and the plurality of touch leads 140 abut against and connect with the second area. The conductive structure 16 provided in this manner is simpler, and it is easy to make in process. Of course, in other embodiments, the conductive structure 16 can also directly include a conductive pillar, two ends of the conductive pillar abut against and connect with the first area of the metal wiring layer 12 and the plurality of touch leads 140 respectively.

In an application scene, as shown in FIG. 1, the conductive layer 162 is disposed in a top surface (not labeled) of the insulation layer 160, and the plurality of touch leads 140 abut against and connect with the conductive layer 162 which is disposed in the top surface of the insulation layer 160 and is close to the touch layer 14. This design manner can make a distance between the touch leads 140 and the conductive structure 16 be reduced as much as possible, thus it is easier to realize electric connection between the touch leads 140 and the conductive structure 16.

In another application scene, the insulation layer 160 has at least two insulation sub-layers that are stacked with each other, and the conductive layer 162 has at least two conductive sub-layers that are electrically connected with each other; the at least two insulation sub-layers 160 and the at least two conductive sub-layers 162 are disposed alternately, and each one of the at least two conductive sub-layers 162 extends in a surface and/or an inner hole of an adjacent one of the at least two insulation sub-layers 160. This design manner can make the process be easier to realize when forming the conductive structure 16, and it is possible to reduce a distance between the touch leads 140 and the conductive layer 162 of the conductive structure 16, such that it is easier to electrically connect the touch leads 140 with the conductive structure 16.

Furthermore, in this embodiment, the conductive layer 162 includes at least one contacting area, and the plurality of touch leads 140 are connected with the at least one contacting area. For example, as shown in FIG. 2, the plurality of touch leads 140 can be connected with the same contacting area on the conductive layer 162. For another example, ones of the touch leads 140 in an upper half part in FIG. 2 can be connected with one contacting area, and ones of the touch leads 140 in a lower half part in FIG. 2 can be connected with another contacting area. Specifically, it is possible to design appropriate contacting areas according to wiring cases of actual touch leads 140, such that wiring of the touch leads 140 is simpler.

In a specific embodiment, as shown in FIG. 1, the conductive structure 16 can include two insulation layers 160 and two conductive layers 62. Specifically, the conductive structure 16 includes the follows.

A first insulation layer 160a is located at a side of the metal wiring layer 12 away from the array layer 10, and the first area of the metal wiring layer 12 is exposed from the first insulation layer 160a. For example, in a manner I, a part of the first insulation layer 160a corresponding to the first area is provided with a first hole (not labeled). In a manner II, the first insulation layer 160a is an entire piece, there is no hole provided therein, and the first insulation layer 160a does not cover the first area.

A first conductive layer 162a is disposed in at least a part of a surface of the first insulation layer 160a, and is electrically connected with the metal wiring layer 12 in the first area. For example, corresponding to the above manner I, the first conductive layer 162a can cover an inner wall of the first hole and at least a part of a surface of a side of the first insulation layer 160a away from the array layer 10 which is adjacent to the first hole, such that the first conductive layer 162a is electrically connected to the first area. Corresponding to the above manner II, the first conductive layer 162a can cover a side surface of the first insulation layer 160a adjacent to the first area and a surface of a side of the first insulation layer 160a away from the array layer 10.

A second insulation layer 160b is located at a side of the first conductive layer 162a away from the first insulation layer 160a, and a part of the first conductive layer 162a is exposed from the second insulation layer 160b. For example, in a manner A, a part of the second insulation layer 160b corresponding to the first conductive layer 162a is provided with a second hole (not labeled), and a part of the first conductive layer 162a corresponding to the second hole is exposed from the second insulation layer 160b. When the first insulation layer 160a is provided with the first hole, the first hole can be disposed in stagger with all second holes. In a manner B, the second insulation layer 160b is an entire piece, there is no hole provided therein, and the second insulation layer 160b does not entirely cover (i.e., partially is disposed in) the first conductive layer 162a.

A second conductive layer 162b is disposed in at least a part of a surface of the second insulation layer 160b, and the second conductive layer 162b is electrically connected with a part of the first conductive layer 160a exposed from the second insulation layer 160b. In this case, the plurality of touch leads 140 can abut against and connect with the second conductive layer 162b. Corresponding to the above manner A, the second conductive layer 162a is disposed in at least a part of an inner wall of the second hole and at least a part of a surface of the second insulation layer 160b adjacent to the second hole, such that the second conductive layer 162b is electrically connected to the first conductive layer 162a. Corresponding to the above manner B, the second conductive layer 162b can cover a side surface of the second insulation layer 160b adjacent to the first conductive layer 162a and a surface of a side of the second insulation layer 160b away from the array layer 10.

The structural design of the aforesaid conductive structure 16 is simpler; moreover, by mutual cooperation between multiple insulation layers 160 and conductive layers 162, the conductive structure 16 is enabled to realize electrical connection with the touch leads 140 and the metal wiring layer 12.

Figure 3:
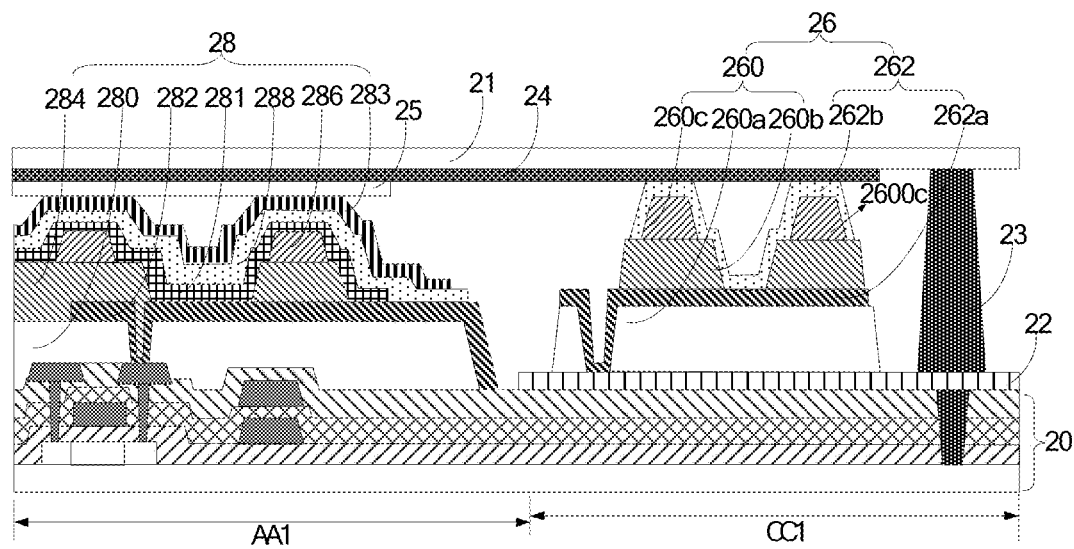
FIG. 3 is a structural schematic view of another embodiment of a display panel of the present application.

In another specific embodiment, as shown in FIG. 3, FIG. 3 is a structural schematic view of another embodiment of a display panel of the present application. In this embodiment, a conductive structure 26 can include three insulation layers 260 and two conductive layers 262, specifically, the conductive structure 26 includes: a first insulation layer 260a located at a side of a metal wiring layer 22 away from an array layer 20, and a first area of the metal wiring layer 22 is exposed from the first insulation layer 260a. For example, a part of the first insulation layer 260a corresponding to the first area is provided with a first hole (not labeled).

A first conductive layer 262a is disposed in at least a part of a surface of the first insulation layer 260a, and is electrically connected with the metal wiring layer 22 in the first area. For example, the first conductive layer 262a can cover an inner surface of the first hole and at least a part of a surface of a side of the first insulation layer 260a away from the array layer 20 which is adjacent to the first hole, such that the first conductive layer 262a is electrically connected with the first area.

A second insulation layer 260b is located at a side of the first conductive layer 262a away from the first insulation layer 260a, and a part of the first conductive layer 262a is exposed from the second insulation layer 260b. For example, a part of the second insulation layer 260b corresponding to the first conductive layer 262a is provided with at least one second hole (not labeled), a part of the first conductive layer 262a corresponding to the second hole is exposed from the second insulation layer 260b. Moreover, if the first insulation layer 260a is provided with the first hole, the first hole can be disposed in stagger with all second holes.

A second conductive layer 262b is disposed in at least a part of a surface of the second insulation layer 260b, and the second conductive layer 262b is electrically connected with a part of the first conductive layer 262a exposed from the second insulation layer 260b. For example, the second conductive layer 262b is disposed in at least a part of an inner wall of the second hole and at least a part of a surface of the second insulation layer 260b adjacent to the second hole, such that the second conductive layer 262b is electrically connected with the first conductive layer 262a.

A third insulation layer 260c is located at a side of the second insulation layer 260b away from the first conductive layer 262a; wherein the third insulation layer 260c is provided with at least one third hole, and one third hole is disposed to be in correspondence with one second hole; the second conductive layer 262b is further disposed in at least a part of an inner wall of the at least one third hole and at least a part of a surface of the third insulation layer 260c adjacent to the at least one third hole.

The structural design of the aforesaid conductive structure 26 is simpler; moreover, by mutual cooperation between multiple insulation layers 260 and conductive layers 262, the conductive structure 26 is enabled to realize electrical connection with touch leads and the metal wiring layer 22.

Figure 4:
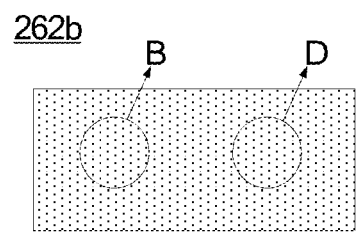
FIG. 4 is a schematic top view of an embodiment of a second conductive layer in FIG. 3.

In addition, combining FIG. 3 with FIG. 4, FIG. 4 is a schematic top view of an embodiment of a second conductive layer in FIG. 3. At least one third hole divides the third insulation layer 260c into multiple pillars 2600c separated from each other (for example, there are two in FIG. 3), the second conductive layer 262b is further disposed in top surfaces of the multiple pillars 2600c, and the plurality of touch leads 140 abut against and connect with the second conductive layer 262b on the top surfaces of the pillars 2600c. For example, some touch leads can abut against and connect with the second conductive layers 262b on the top surfaces of the pillars 2600c at the left side (for example, the area B in FIG. 4), and the other touch leads 140 can abut against and connect with the second conductive layers 262b on the top surfaces of the pillars 2600c at the right side (for example, the area D in FIG. 4). For example, two or more third holes divide the third insulation layer 260c into multiple pillars 2600c separated from each other. The aforesaid design manner can make connection between the touch leads 140 and the conductive structure 16 be more stable and wiring of the touch leads 140 be simpler.

Furthermore, also referring to FIG. 3, the functional film layers 28 in the display panel provided by the present application includes a planarization layer 280, an anode layer 282, a pixel definition layer 284, a spacer layer 286, and a cathode layer 288 which are sequentially stacked in a direction away from the array layer 20; the planarization layer 280 is in contact with the array layer 20.

In this embodiment, the material of the first insulation layer 260a is the same as that of the planarization layer 280, this manner can enable the first insulation layer 260a and the planarization layer 280 to be formed at the same time during processing preparation, so as to lower processing preparation complexity; and/or the material of the first conductive layer 262a is the same as that of the anode layer 282, this manner can enable the first conductive layer 262a and the anode layer 282 to be formed at the same time during processing preparation, so as to lower processing preparation complexity; and/or the material of the second insulation layer 260b is the same as that of the pixel definition layer 284, this manner can enable the second insulation layer 260b and the pixel definition layer 284 to be formed at the same time during processing preparation, so as to lower processing preparation complexity; and/or the material of the third insulation layer 260c is the same as that of the spacer layer 286, this manner can enable the third insulation layer 260c and the spacer layer 286 to be formed at the same time during processing preparation, so as to lower processing preparation complexity; and/or the material of the second conductive layer 262b is the same as that of the cathode layer 288, this manner can enable the second conductive layer 262b and the cathode layer 288 to be formed at the same time during processing preparation, so as to lower processing preparation complexity.

Furthermore, the functional film layers 28 can further include a light emission layer 281, a light transmission layer 283, etc.; wherein the pixel definition layer 284 comprises a plurality of pixel definition pillars and a plurality of openings disposed between the pixel definition pillars, the light emission layer 281 can be located in the openings of the pixel definition layer 284; the light transmission layer 283 can cover the cathode layer 288 such that light emitted from the light emission layer 281 can emit out better. In addition, as shown in FIG. 3, an insulation layer 25 can be disposed between the touch layer 24 and the light transmission layer 283, so as to lower effect of the functional film layers 28 on the touch layer 24.

Furthermore, a top surface of the conductive structure 26 can be flush with a surface of a side of the touch layer 24 facing the array layer 20, or the top surface of the conductive structure 26 can be slightly lower than the surface of the side of the touch layer 24 facing the array layer 20. Since the functional film layers 28 includes the light emission layer 281 and the light transmission layer 283, in order to compensate a height difference formed by the light emission layer 281 and the light transmission layer 283 and enable the conductive structure 26 to be close to the touch layer 24 as much as possible, when forming the aforesaid second insulation layer 260b, a height of the second insulation layer 260b can be greater that a height of the pixel definition layer 284; alternatively, when forming the aforesaid third insulation layer 260c, a height of the third insulation layer 260c is greater that a height of the space layer 286.

In a further embodiment, also referring to FIG. 3, the display panel provided by the present application further includes a cover plate 21 and a sealing element 23. The cover plate 21 is located at a side of the touch layer 24 away from the array layer 20, and the cover plate 21 is disposed in the display region AA1 and the non-display region CC1, the cover plate 21 can provide a protection function. The sealing element 23 (e.g., a Frit sealing element) surrounds between an edge of the cover plate 21 and an edge of the array layer 20, and the sealing element 23 is located on an outside of the uplifted conductive layer 26. The sealing element 23 can be ring-shaped, and can reduce corrosion of external water vapor to the inner film layers of the display panel.

Moreover, as shown in FIG. 3, the array layer 20 is provided with a recess corresponding to the sealing element 23, and the sealing element 23 extends into the recess. For example, the metal wiring layer 22 is formed by a multiple metal wires disposed spacedly, the recess can be disposed at a position that is not covered by the metal wires, and the design manner of the recess can improve sealing performance of the sealing element 23.

The display panel provided by the present application is further illustrated below from the aspect of a preparation method. Also referring to FIG. 3, the preparation method includes the follows.

A: the array layer 20 is formed, wherein the array layer 20 is disposed in the display region AA1 and the non-display region CC1.

B: the metal wiring layer 22 is formed on a part of the array layer 20 in the non-display region CC1.

C: a patterned first organic glue layer is formed in a manner of coating at a side of the array layer 20, wherein a part of the first organic glue layer in the display region AA1 forms the planarization layer 280, and a part of the first organic glue layer in the non-display region CC1 forms the first insulation layer 260a.

D: a patterned first metal layer is formed by a chemical vapor deposition method at a side of the first organic glue layer away from the array layer 20, wherein a part of the first metal layer in the display region AA1 forms the anode layer 282, and a part of the first metal layer in the non-display region CC1 forms the first conductive layer 262a.

E: a patterned second organic glue layer is formed in a manner of coating at a side of the first metal layer, wherein a part of the second organic glue layer in the display region AA1 forms the pixel definition layer 284, and a part of the second organic glue layer in the non-display region CC1 forms the second insulation layer 260b.

F: a patterned third organic glue layer is formed in a manner of coating at a side of the second organic glue layer, wherein a part of the third organic glue layer in the display region AA1 forms the spacer layer 286, and a part of the third organic glue layer in the non-display region CC1 forms the third insulation layer 260c.

G: a patterned second metal layer is formed by a chemical vapor deposition method at a side of the third organic glue layer, wherein a part of the second metal layer in the display region AA1 forms the cathode layer 288, and a part of the second metal layer in the non-display region CC1 forms the second conductive layer 262b.

H: the cover plate 21 forming the touch layer 24 thereon is disposed at a side of the second metal layer, wherein the touch layer 24 is located between the cover 21 and the second metal layer, and the touch leads of the touch layer 24 is in contact with the second conductive layer 262b.

Figure 5:
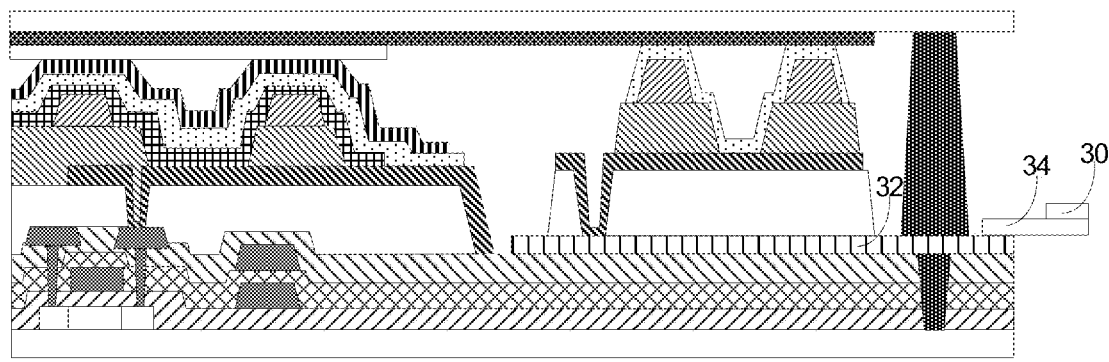
FIG. 5 is a structural schematic view of an embodiment of a display device of the present application.

Referring to FIG. 5, FIG. 5 is a structural schematic view of an embodiment of a display device of the present application. The display device, besides including a display panel of any one of the above embodiments, can further include a touch chip 30, the touch chip 30 can be electrically connected with a metal wiring layer 32 through a chip on film (COF) 34.

The above described are only embodiments of the present application, and are not intended to limit the patent scope of the present application. Any equivalent structure or equivalent process transformation made using the content of the specification and drawings of the present application, or direct or indirect application in other related technical fields, are all similarly included in the patent protection scope of the present application.

What is claimed is:

1. A display panel, which defines a display region and a non-display region located around the display region, and comprises:
    an array layer disposed in the display region and the non-display region;
    a metal wiring layer disposed in a part of the array layer located in the non-display region, wherein one end of the metal wiring layer is configured to be electrically connected to a touch chip;
    a touch layer located at a side of the metal wiring layer away from the array layer, wherein the touch layer comprises a plurality of touch leads, and the plurality of touch leads extend from the display region to the non-display region;
    a plurality of functional film layers located between the array layer and the touch control layer and located in the display region; and
    a conductive structure located between the metal wiring layer and the touch control layer, wherein the plurality of touch leads are electrically connected to the metal wiring layer through the conductive structure; wherein the conductive structure is located in the same layer as at least one of the functional film layers; wherein the conductive structure comprising an insulation layer and a conductive layer;

the insulation layer comprising at least two insulation sub-layers stacked with each other; and the conductive layer comprising at least two conductive sub-layers that are electrically connected with each other;

wherein the at least two insulation sub-layers and the at least two conductive sub-layers are disposed alternately, and each one of the at least two conductive sub-layers extends in a surface and/or an inner hole of an adjacent one of the at least two insulation sub-layers.

2. The display panel according to claim 1, wherein the insulation layer is located between the metal wiring layer and the touch layer, wherein the metal wiring layer comprises a first area exposed from the insulation layer; and wherein the conductive layer extends from a surface and/or an inner hole of the insulation layer and contacts the first area; wherein the plurality of touch leads are electrically connected with the metal wiring layer through the conductive layer.

3. The display panel according to claim 1, wherein the conductive structure comprises:

a first insulation layer located at the side of the metal wiring layer away from the array layer, wherein the metal wiring layer comprises a first area exposed from the first insulation layer;

a first conductive layer disposed in at least a part of a surface of the first insulation layer and electrically connected with the metal wiring layer in the first area;

a second insulation layer located at a side of the first conductive layer away from the first insulation layer, wherein a part of the first conductive layer exposes from the second insulation layer; and a second conductive layer disposed in at least a part of a surface of the second insulation layer, wherein a part of the second conductive layer exposed from the second insulation layer is electrically connected with the first conductive layer.

4. The display panel according to claim 3, wherein a part of the first insulation layer corresponding to the first area is provided with a first hole, the first conductive layer is disposed in an inner wall of the first hole and at least a part of a surface of a side of the first insulation layer away from the array layer and adjacent to the first hole;

a part of the second insulation layer corresponding to the first conductive layer is provided with at least one second hole, the first hole is staggered with the at least one second hole, and the second conductive layer is disposed in at least a part of an inner wall of the second hole and at least a part of a surface of a side of the second insulation layer away from the array layer and adjacent to the second hole.

5. The display panel according to claim 3, wherein the first insulation layer does not comprises a hole, and the first insulation layer does not cover the first area; the first conductive layer is disposed in a side surface of the first insulation layer adjacent to the first area and a surface of a side of the first insulation layer away from the array layer;

the second insulation layer does not comprises a hole, and the second insulation layer partially is disposed in the first conductive layer; the first conductive layer is disposed in a side surface of the second insulation layer adjacent to the first conductive layer and a surface of a side of the second insulation layer away from the array layer.

6. The display panel according to claim 4, wherein, the conductive structure further comprises:

a third insulation layer located at a side of the second insulation layer away from the first conductive layer, wherein the third insulation layer is provided with at least one third hole, and the at least one third hole is arranged to be in correspondence with the at least one second hole; the second conductive layer is further disposed in at least a part of an inner wall of the third hole and at least a part of a surface of the third insulation layer adjacent to the at least one third hole.

7. The display panel according to claim 6, wherein the at least one third hole comprises at least two third holes divide the third insulation layer into a plurality of pillars separated from each other, the second conductive layer covers top surfaces of the plurality of pillars, and the plurality of touch leads abut against and connect with the second conductive layer located on the top surfaces of the pillars.

8. The display panel according to claim 7, wherein the plurality of touch leads abut against and connect with the conductive layer which covers the top surfaces of the pillars and is disposed adjacent to the touch layer.

9. The display panel according to claim 2, wherein the conductive layer comprises at least one contacting area, and the plurality of touch leads are connected with the at least one contacting area.

10. The display panel according to claim 6, wherein the plurality of functional film layers comprise a planarization layer, an anode layer, a pixel definition layer, a spacer layer, and a cathode layer which are sequentially stacked in a direction away from the array layer;

wherein, the material of the first insulation layer is the same as that of the planarization layer, and/or the material of the first conductive layer is the same as that of the anode layer, and/or the material of the second insulation layer is the same as that of the pixel definition layer, and/or the material of the third insulation layer is the same as that of the spacer layer, and/or the material of the second conductive layer is the same as that of the cathode layer.

11. The display panel according to claim 10, wherein the functional film layers further comprise a light emission layer and a light transmission layer, wherein the pixel definition layer comprises a plurality of pixel definition pillars and a plurality of openings disposed between the pixel definition pillars, the light emission layer is located in the openings of the pixel definition layer, the light transmission layer is disposed in the cathode layer, and an insulation layer is disposed between the touch layer and the light transmission layer.

12. The display panel according to claim 11, wherein a top surface of the uplifted conductive layer is flush with a surface of a side of the touch layer facing the array layer.

13. The display panel according to claim 12, wherein
a height of the second insulation layer is greater than a height of the pixel definition layer, or a height of the third insulation layer is greater than a height of the spacer layer.

14. The display panel according to claim 1, further comprising:
a cover plate located at a side of the touch layer away from the array layer, wherein the cover plate is disposed in both the display region and the non-display region; and
a sealing element disposed between an edge of the cover plate and an edge of the array layer, wherein the sealing element is located on an outer side of the conductive structure.

15. The display panel according to claim 14, wherein
the array layer is provided with a recess corresponding to the sealing element, and the sealing element extends into the recess.

16. The display panel according to claim 14, wherein
the sealing element is ring-shaped.

17. The display panel according to claim 1, wherein the conductive structure comprises two contacting areas disposed in one side thereof adjacent to the touch layer, part of the touch leads are connected with one of the two contacting areas, and part of the touch leads are connected with the other one of the two contacting areas.

18. A display device comprising a display panel of claim 1 and a touch chip, wherein the touch chip is electrically connected with the metal wiring layer.

19. A display panel, which defines a display region and a non-display region located around the display region, and comprises:
an array layer disposed in the display region and the non-display region;
a metal wiring layer disposed in a part of the array layer located in the non-display region, wherein one end of the metal wiring layer is configured to be electrically connected to a touch chip;
a touch layer located at a side of the metal wiring layer away from the array layer, wherein the touch layer comprises a plurality of touch leads, and the plurality of touch leads extend from the display region to the non-display region;
a plurality of functional film layers located between the array layer and the touch control layer and located in the display region; and
a conductive structure located between the metal wiring layer and the touch control layer, wherein the plurality of touch leads are electrically connected to the metal wiring layer through the conductive structure; wherein the conductive structure is located in the same layer as at least one of the functional film layers,
wherein the conductive structure comprises:
a first insulation layer located at the side of the metal wiring layer away from the array layer, wherein the metal wiring layer comprises a first area exposed from the first insulation layer;
a first conductive layer disposed in at least a part of a surface of the first insulation layer and electrically connected with the metal wiring layer in the first area;
a second insulation layer located at a side of the first conductive layer away from the first insulation layer, wherein a part of the first conductive layer exposes from the second insulation layer; and
a second conductive layer disposed in at least a part of a surface of the second insulation layer, wherein a part of the second conductive layer exposed from the second insulation layer is electrically connected with the first conductive layer.

20. The display panel according to claim 19, wherein
a part of the first insulation layer corresponding to the first area is provided with a first hole, the first conductive layer is disposed in an inner wall of the first hole and at least a part of a surface of a side of the first insulation layer away from the array layer and adjacent to the first hole; a part of the second insulation layer corresponding to the first conductive layer is provided with at least one second hole, the first hole is staggered with the at least one second hole, and the second conductive layer is disposed in at least a part of an inner wall of the second hole and at least a part of a surface of a side of the second insulation layer away from the array layer and adjacent to the second hole;
or the first insulation layer does not comprises a hole, and the first insulation layer does not cover the first area; the first conductive layer is disposed in a side surface of the first insulation layer adjacent to the first area and a surface of a side of the first insulation layer away from the array layer; the second insulation layer does not comprises a hole, and the second insulation layer partially is disposed in the first conductive layer; the first conductive layer is disposed in a side surface of the second insulation layer adjacent to the first conductive layer and a surface of a side of the second insulation layer away from the array layer.

* * * * *